United States Patent
Glazek et al.

(10) Patent No.: US 10,410,835 B2
(45) Date of Patent: Sep. 10, 2019

(54) PLASMA IMPEDANCE MATCHING FOR SUPPLYING RF POWER TO A PLASMA LOAD

(71) Applicant: TRUMPF Huettinger Sp. z o. o., Zielonka (PL)

(72) Inventors: Wojciech Glazek, Warsaw (PL); Rafal Bugyi, Warsaw (PL)

(73) Assignee: TRUMPF Huettinger Sp. z o. o., Zielonka (PL)

( * ) Notice: Subject to any disclaimer, the term of this patent is extended or adjusted under 35 U.S.C. 154(b) by 0 days.

(21) Appl. No.: 15/802,854

(22) Filed: Nov. 3, 2017

(65) Prior Publication Data
US 2018/0053633 A1 Feb. 22, 2018

Related U.S. Application Data

(63) Continuation of application No. PCT/EP2016/059970, filed on May 4, 2016.

(30) Foreign Application Priority Data

May 5, 2015 (EP) ..................................... 15461529

(51) Int. Cl.
*H01J 37/32* (2006.01)
*H03H 7/38* (2006.01)
(52) U.S. Cl.
CPC .... *H01J 37/32183* (2013.01); *H01J 37/3299* (2013.01); *H01J 37/32174* (2013.01);
(Continued)
(58) Field of Classification Search
None
See application file for complete search history.

(56) References Cited

U.S. PATENT DOCUMENTS 6,313,584 B1 * 11/2001 Johnson ............ H01J 37/32082
315/111.21
7,886,690 B2 2/2011 Ellingboe
(Continued)

FOREIGN PATENT DOCUMENTS

CN 101853763 A 10/2010
JP 2001-118700 4/2001
(Continued)

OTHER PUBLICATIONS

International Search Report for International Application No. PCT/EP2016/059970 dated Jul. 26, 2016 (3 pages).
(Continued)

*Primary Examiner* — Dion Ferguson
*Assistant Examiner* — Srinivas Sathiraju
(74) *Attorney, Agent, or Firm* — Fish & Richardson P.C.

(57) ABSTRACT

A plasma impedance matching unit for a plasma power supply system includes a first power connector for coupling the matching unit to a RF power source, a second power connector for coupling the matching unit to a plasma load, a data link interface for directly coupling the matching unit to another plasma impedance matching unit via a data link, and a controller configured to control the matching unit to match an impedance from the first power connector to an impedance at the second power connector, to operate as a master for at least one other impedance matching unit and/or at least one RF power source of the plasma power supply system, and to communicate via the data link interface with the at least one other impedance matching unit and/or the at least one RF power source of the plasma power supply system.

25 Claims, 2 Drawing Sheets

(52) U.S. Cl.
CPC ... *H01J 37/32935* (2013.01); *H01J 37/32926* (2013.01); *H03H 7/38* (2013.01)

(56) References Cited

U.S. PATENT DOCUMENTS

| | | | | |
|---|---|---|---|---|
| 8,344,559 | B2 | 1/2013 | Van Zyl et al. | |
| 9,043,525 | B2* | 5/2015 | Valcore, Jr. | G06F 13/40 |
| | | | | 710/305 |
| 9,171,699 | B2* | 10/2015 | Valcore, Jr. | H01J 37/32082 |
| 9,368,329 | B2* | 6/2016 | Valcore, Jr. | H01J 37/32146 |
| 9,536,749 | B2* | 1/2017 | Marakhtanov | H01L 21/67069 |
| 9,544,987 | B2* | 1/2017 | Mueller | H01J 37/32155 |
| 9,595,424 | B2* | 3/2017 | Marakhtanov | H01J 37/32183 |
| 9,607,810 | B2* | 3/2017 | Valcore, Jr. | H01J 37/32082 |
| 9,652,567 | B2* | 5/2017 | Valcore, Jr. | G06F 17/5009 |
| 9,663,858 | B2* | 5/2017 | Nagami | H01J 37/32146 |
| 9,720,022 | B2* | 8/2017 | Howald | G01R 27/02 |
| 9,721,758 | B2* | 8/2017 | Coumou | H01J 37/32082 |
| 9,837,252 | B2* | 12/2017 | Howald | H01J 37/32926 |
| 10,026,592 | B2* | 7/2018 | Chen | H01J 37/32146 |
| 2009/0284156 | A1 | 11/2009 | Banna et al. | |
| 2010/0248489 | A1* | 9/2010 | Koguchi | H01J 37/32091 |
| | | | | 438/714 |
| 2012/0000888 | A1 | 1/2012 | Kawsaki et al. | |
| 2014/0062303 | A1* | 3/2014 | Hoffman | H05H 1/46 |
| | | | | 315/111.21 |
| 2014/0263199 | A1* | 9/2014 | Nelson | H01J 37/32082 |
| | | | | 219/121.4 |
| 2014/0367043 | A1* | 12/2014 | Bishara | H01J 37/32183 |
| | | | | 156/345.28 |
| 2018/0053633 | A1* | 2/2018 | Glazek | H01J 37/32174 |

FOREIGN PATENT DOCUMENTS

| | | |
|---|---|---|
| JP | 2003318162 A | 11/2003 |
| JP | 2008053496 A | 3/2008 |
| JP | 2010-238881 | 10/2010 |
| JP | 2014-508378 | 4/2014 |
| WO | WO 2008/084660 | 7/2008 |
| WO | WO 2012/094416 | 7/2012 |

OTHER PUBLICATIONS

Office Action in Japanese Application No. 2017-557334, dated Jan. 7, 2019, 10 pages (English translation).

Office Action in Chinese Application No. 201680026033.0, dated Jan. 29, 2019, 24 pages (with English translation).

* cited by examiner

PLASMA IMPEDANCE MATCHING FOR SUPPLYING RF POWER TO A PLASMA LOAD

CROSS-REFERENCE TO RELATED APPLICATIONS

This application is a continuation of and claims priority under 35 U.S.C. § 120 from PCT Application No. PCT/EP2016/059970 filed on May 4, 2016, which claims priority from European Application No. EP 15 461 529.8, filed on May 5, 2015. The entire contents of each of these priority applications are incorporated herein by reference.

TECHNICAL FIELD

The invention relates to a plasma impedance matching unit for a plasma power supply system, a system for supplying RF power to a plasma load, and a method of supplying RF power to a plasma load.

BACKGROUND

The coating of substrates by cathode sputtering in plasma processes is well known. The sputtering can be done conventionally. In some cases, the sputtering can be done by using a reactive gas, which is also called reactive sputtering. To that end, a power supply produces a plasma to remove material from a target, and the removed material is then coated on the substrate. If a reactive process is used, the target atoms in the removed material can combine with gas atoms or molecules, depending on the desired coating.

The electrical impedance of a plasma in a plasma chamber can vary. In particular, the impedance can vary instantly, for example, there may be a high impedance before the plasma ignites and a low impedance once the plasma has been ignited. If a pulsed power supply is used, the impedance of the plasma may change frequently due to frequent igniting of the plasma.

The power produced by an RF power source is supplied to a plasma chamber via an impedance matching unit. The impedance matching unit tries to match the impedance of the plasma to the output impedance of the RF power source.

Plasma processes can be powered by more than one RF power source. Furthermore, plasma parameters may change with time, and the plasma may appear or disappear. This is happening during ignition, arcing or for other reasons. Changing of the plasma properties results in a variation of the (plasma) load impedance an impedance matching unit sees and tries to match to. While the plasma properties change, the power sources and impedance matching units try to adapt to the plasma with the intention that the process result, in particular deposition, is stable in time. If the plasma is powered with many sources, the sources compete in stabilizing the plasma.

In some systems, the plasma impedance matching units each tried to match the impedance of the respective RF power source they were connected to with the impedance of the plasma, not knowing what the other impedance matching units of the plasma supply system were doing. There have been attempts to use a central controller controlling the plasma impedance matching units of a plasma power supply system. However, there was still no interaction between the plasma impedance matching units. Furthermore, the central controller had no information about the plasma state. Therefore, a very crude method had been suggested by performing impedance matching only with one impedance matching unit when the plasma is being ignited and then to use all the impedance matching units for further matching. There had been no provisions for a reaction to instabilities in the plasma.

SUMMARY

Implementations of the present invention can provide a plasma impedance matching unit, a system for supplying RF power to plasma load and a method of supplying RF power to a plasma load for reducing instabilities in a plasma process.

One aspect of the invention features a plasma impedance matching unit for a plasma power supply system, including:
a) a first power connector for coupling the plasma impedance matching unit to a power source,
b) a second power connector for coupling the plasma impedance matching unit to a plasma load,
c) a data link interface for directly coupling the plasma impedance matching unit to another plasma impedance matching unit of the plasma power supply system via a data link,
d) a controller configured to control the plasma impedance matching unit to match a first impedance from the first power connector to a second impedance at the second power connector,
e) where the controller is configured to operate as a master for at least one other impedance matching unit and/or at least one RF power source of the plasma power supply system, and where the controller is configured to communicate via the data link interface with the other impedance matching unit(s) and/or the RF power source(s) of the plasma power supply system.

Such a plasma impedance matching unit, which is configured to operate as a master for other plasma impedance matching units may decide, which plasma impedance matching unit performs impedance matching and which impedance matching unit does not perform impedance matching. It is thus possible to reduce the number of plasma impedance matching units actually performing impedance matching. This can result in shorter plasma instabilities, which makes the plasma process more stable and therefore increases a quality of a product of a plasma process.

The plasma load includes an antenna assembly configured to couple RF power into a plasma chamber in which a plasma can be ignited. The controller of the plasma impedance matching unit may have direct access to all the data of the plasma impedance matching unit, in particular to the data concerning one or more properties of the plasma in the plasma chamber. Therefore, a much faster reaction can take place as compared to the case where a central controller is used to control different matching units of a plasma power supply system.

Moreover, by disabling one or more of the other plasma impedance matching units of the plasma power supply system, much faster impedance matching can be performed by the plasma impedance matching unit that is actually performing impedance matching. The impedance matching may be performed by the master or the master may instruct an impedance matching unit operated as a slave to perform impedance matching. Interference from the other plasma impedance matching unit (or units) may be reduced. It may be reduced so that there is no interference from other plasma impedance matching units.

Furthermore, by directly communicating via the data link interface with other plasma impedance matching units of the plasma power supply system, the plasma impedance matching unit can send and receive data to and from the other plasma impedance matching units. Thus, it is possible for the plasma impedance matching unit acting as a master to directly control the other plasma impedance matching units. Hence, it can be avoided that different plasma impedance matching units compete in stabilizing the plasma. Stabilization can only be done by one plasma impedance matching unit, in particular the one that is operated as a master. Thus, it is avoided that competition in stabilizing the plasma actually worsens the stabilization efficiency.

The plasma impedance matching unit may be configured to be arranged at a distance from the other impedance matching unit(s). In some cases, two impedance matching units are placed on opposite parts of the plasma chamber.

The plasma impedance matching unit may include a metallic housing in which all other parts of the impedance matching unit are enclosed. The data link interface may be placed directly at the metallic housing. The first power connector may be placed directly at the metallic housing. The second power connector may be placed directly at the metallic housing. Placing the power connectors and/or the interface directly at the metallic housing has the advantage of further stabilizing the regulation due to a decrease of electromagnetic interference. The power source is outside the metallic housing.

The plasma impedance matching unit may include various reactances, which are controlled by the controller. Thus, impedance matching can be performed by changing reactances, for example, by changing an inductance of an inductor or a capacitance of a capacitor.

The plasma impedance matching unit may include at least one sensor configured to measure a value related to the impedance at the second power connector of the plasma impedance matching unit, such as a voltage, a current or a phase between a voltage and a current, a forward power delivered to the plasma and/or a reflected power reflected by the plasma.

The sensor may further be configured to measure harmonics of the mentioned signals. The sensor may further be configured to detect arcs in the plasma process.

There may be a connection between the sensor and the controller so that the controller is capable of controlling a matching network of the plasma impedance matching unit based on the measured data.

The plasma impedance matching unit may also be configurable to be operated as a slave.

Furthermore, the controller may be configured to send or receive a hold signal to or from the at least one other impedance matching unit and/or at least one RF power source of the plasma power supply system. By sending a hold signal other plasma impedance matching units can be put on hold, e.g., put in a state, in which they do not try to match the impedance from a first power connector to the impedance at a second power connector. Thus, it can be prevented that the other plasma impedance matching unit tries to stabilize the plasma by trying to match the impedance to the plasma.

On the other hand, the plasma impedance matching unit operated as a master may decide that it is beneficial for another plasma impedance matching unit to try to match the impedance and thus stabilize the plasma. In this case, the plasma impedance matching unit operated as the master may stop the impedance matching and control another impedance matching unit to perform the impedance matching. Additionally, it is possible for the plasma impedance matching unit operated as the master to receive data from another plasma impedance matching unit, in particular data obtained by the other impedance matching unit related to the condition of the plasma.

The plasma impedance matching unit may also be connected to at least one RF power source, in particular to a RF power source which can perform impedance matching by varying a frequency of its output signal. By being able to send a hold signal to such a RF power source, the plasma impedance matching unit can also force the RF power source to stop the impedance matching.

The controller may be configured to detect a plasma state condition. In particular, the controller may be configured to detect instabilities in the plasma. Based on the data obtained, stabilization can be performed by the plasma impedance matching unit.

The controller may be configured to send a hold or a start signal to a controller of another plasma impedance matching unit after detection of a plasma state condition. In particular, a signal can be sent in dependence on detection of an ignition of a plasma, arcing, a stable or instable plasma or any other abnormality of the plasma.

Another aspect of the invention features a system for supplying RF power to a plasma load, including:
 a) a first RF power source,
 b) a first impedance matching unit, which may be embodied as a master, coupling the first RF power source to a plasma load,
 c) a second RF power source,
 d) a second plasma impedance matching unit, which may be embodied as a slave, coupling the second RF power source to the plasma load, and
 e) a data link directly connecting the first and second plasma impedance matching units.

Such a system may react much faster to instabilities in the plasma load because the plasma impedance matching units can directly communicate via the data link directly connecting the first and second plasma impedance matching units. Hence, it can be avoided, that the plasma impedance matching units try to compete in stabilizing the plasma. That means much faster stabilization of a plasma process can be realized. The first impedance matching unit, in particular its controller, may be configured to operate as a master and the second impedance matching unit, in particular its controller, may be configured to operate as a slave.

Coordination of the impedance matching of at least two impedance matching units may result in improved matching stability, e.g., improved stability of the overall plasma supply system. Furthermore, the ignition time of the plasma may be reduced and the ignition stability, e.g., stability of the plasma supply system during ignition, may be improved, thereby reducing contamination of the substrate with particles.

A direct data link between the impedance matching units offers the possibility of determining the phase shift of the output signals of the impedance matching units.

For example, the phase shift between the output voltage of the first impedance matching unit and the output voltage of the second impedance matching unit may be determined by measuring the output voltages of both the impedance matching units and comparing them using the direct data link between the impedance matching units.

This information may be used to adjust the phase of at least one output signal of the first and second RF power source.

A customer may set a desired phase shift between an output signal supplied by the first impedance matching unit to the plasma load and an output signal supplied by the second impedance matching unit to the plasma load.

Based on the determined phase shift the output signals of the RF power sources may be adjusted to match the determined phase shift to the set phase shift. Thereby the phase shift caused by the impedance matching units may be taken into consideration.

At least one of the RF power sources may be capable of working in a pulsed mode and/or in a mode where the frequency is controlled to accomplish a matching to a load. By using a RF power source, charging effects can be mitigated and charging damage can be avoided. A faster impedance matching can be obtained, if the frequency of the RF power source can be controlled.

At least one of the RF power sources may be capable to regulate one or more of the following values:
  forward power,
  reflected power,
  voltage,
  current,
  impedance,
  phase of voltage, current or power signal at its output, and
  frequency output.

The system may include two impedance matching units arranged at a distance from each other. Two impedance matching units can be placed on opposite parts of the plasma chamber. Both plasma impedance matching units may include a metallic housing in which all other parts of the impedance matching unit are enclosed.

The first and second RF power sources may be directly connected via a second data link. Thus, the RF power sources can directly communicate and the plasma process can be controlled very quickly.

In some cases, the direct data link for connecting the first and second impedance matching units and the second data link for connecting the first and second RF power sources can be directly connected via a data link connection. Thus, all the RF power sources and all the impedance matching units of the power supply system may be connected to a direct data link and data may be exchanged via the direct data link.

In some cases, one of the first and second RF power sources may be connected to respective plasma impedance matching units via an additional data link. Thus, the plasma impedance matching unit may communicate with the RF power source connected to the plasma impedance matching unit such that the impedance matching of the RF power source can be stopped to accelerate stabilizing of the plasma in the plasma chamber. Furthermore, the first and/or second impedance matching units, in particular their controllers, may have direct access to the plasma process parameters. The plasma process parameters may be used to control the impedance matching units and the RF power sources.

A further aspect of the invention features a method of supplying RF power to a plasma load by a power supply system, including:
  a) supplying RF power generated by a first RF power source of the power supply system to the plasma load via a first impedance matching unit of the power supply system,
  b) supplying RF power generated by a second RF power source of the power supply system to the plasma load via a second impedance matching unit of the power supply system, and
  c) sending data from the first impedance matching unit to the second impedance matching unit via a direct data link.

Thus, shorter plasma instabilities can be realized, which makes the plasma process more stable. Data may be sent from the first RF power source to the second RF power source via a second direct data link. Thus, interference of the RF power sources with the stabilization of the plasma may be avoided.

At least the first RF power source, the second RF power source, the first impedance matching unit, and the second impedance matching unit, in particular all the RF power sources and all the impedance matching units of the power supply system, may be connected to a direct data link and data may be exchanged via the direct data link. Thus, all the devices mentioned above can communicate without the interference of an external control unit. Thus, data may be transferred and computed much faster to improve stabilization of the plasma process.

An instability of the plasma may be detected, in particular by detecting a variation in the plasma load impedance, and impedance matching may be performed such that the impedance matching unit(s) and/or the RF power source(s) of the power supply system do not compete in stabilizing the plasma. In particular, only one of the impedance matching unit and RF power sources may be used for impedance matching and thus for stabilizing the plasma, while all the other units are put on hold.

Moreover, one of the impedance matching units or one of the RF power sources of the power supply system may be operated to stabilize the plasma and the other impedance matching units and RF power supplies of the power supply system are operated such that they do not perform impedance matching, e.g., do not try to stabilize the plasma. In particular, one of the impedance matching units or RF power sources may be operated as a master, controlling the impedance matching of the other impedance matching units and/or RF power sources of the system.

One of the impedance matching units at a time may be operated to impedance match the load, while the other impedance matching units of the plasma supply system do not perform impedance matching. Thus, the impedance matching units may take turns in performing the impedance matching.

Alternatively, one of the RF power sources at a time may be operated to impedance match the load, while the other RF power sources of the plasma supply system do not perform impedance matching. Again, the RF power sources may take turns in performing the impedance matching, while the other RF power sources do not perform impedance matching.

In a further alternative, one of the impedance matching units and RF power sources at a time may be operated to impedance match the load, while the other impedance matching units and RF power sources of the plasma supply system do not perform impedance matching. The impedance matching units and RF power sources may take turns in performing the impedance matching.

The foregoing objects, features and advantages of the invention as well as the invention itself will be more fully understood from the following description, when read together with the accompanying drawings, which are not necessarily to scale.

DETAILED DESCRIPTION

Figure 1:
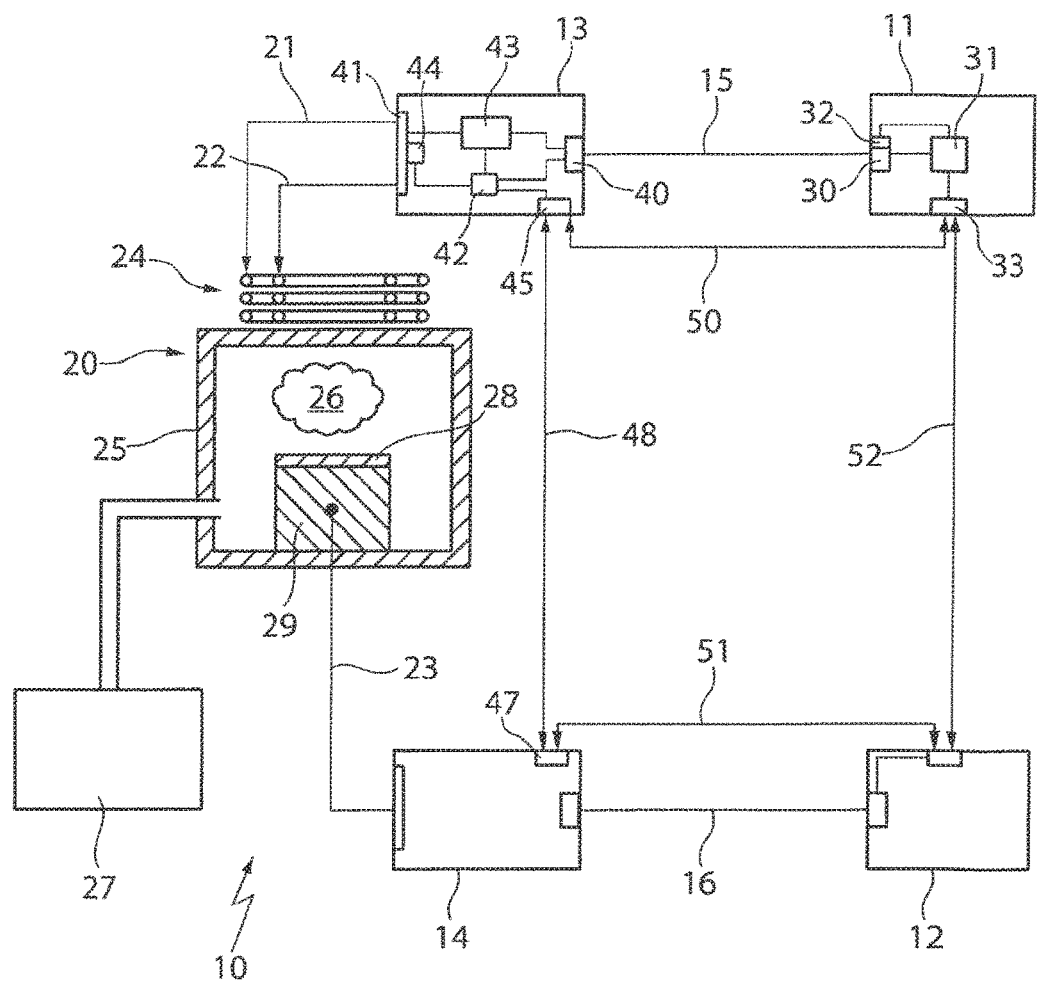
FIG. 1 is a schematic diagram of an example plasma supply system.

FIG. 1 shows a first plasma supply system 10, including a first radio frequency (RF) power source 11 and a second RF power source 12. The RF power sources 11, 12 are connected to plasma impedance matching units 13, 14 respectively via power lines 15, 16. The impedance matching unit 13 is coupled to a plasma load 20 via power lines 21, 22 and the impedance matching unit 14 is coupled to the plasma load 20 via a power line 23. In the present embodiment, the plasma load 20 includes an antenna assembly 24 for coupling RF power into a plasma chamber 25 in which a plasma 26 can be ignited. Process gases are supplied from a processed gas supply 27 to the plasma chamber 25, in which a substrate 28 may be provided on a cathode 29.

The RF power source 11 includes an output power connector 30, which is connected to the power line 15. An output power of the output power connector 30 can be controlled by a controller 31, which also receives information from a sensor 32 provided at the output power connector 30 of the RF power source 11. The controller 31 may also receive information via a data link interface 33, e.g., from the second RF power source 12. In particular, the controller 31 may be configured to vary a frequency of an output signal provided at the output power connector 30 to match an impedance of the RF power source 11 to an impedance of the plasma load 20.

The impedance matching unit 13 includes a first power connector 40 for coupling the impedance matching unit 13 to the RF power source 11 via the power line 15. A second power connector 41 is provided for coupling the matching unit 13 to the plasma load 20. A controller 42 is configured to control the matching unit 13 to match the impedance from the first power connector 40 to the impedance at the second power connector 41, e.g., the impedance of the plasma load 20. To match the impedances, the controller 42 controls an impedance matching network 43. The controller 42 is connected to a sensor 44, which receives information related to a condition of the plasma 26 in the plasma chamber 25. Information provided by the sensor 44 can be used by the controller 42 to perform the impedance matching.

The controller 42 is configured to operate as a master for the second impedance matching unit 14. To this end, the controller 42 communicates via a data link interface 45 with the impedance matching unit 14. The impedance matching unit 14 therefore also includes a data link interface 47. The data link interfaces 45, 47 are connected by a direct data link 48. The impedance matching unit 14 may have the same components as the impedance matching unit 13. However, a controller of the impedance matching unit 14 is not be configured to operate as a master but to operate as a slave.

If an instability of the plasma 26 in the plasma chamber 25 is detected, in particular by the sensor 44, impedance matching may only be performed by the impedance matching unit 13. The controller 42 may send a signal to the impedance matching unit 14 forcing the impedance matching unit 14 to be on hold, e.g., not to perform impedance matching so as not to interfere with the impedance matching performed by the impedance matching unit 13. Thus, it can be avoided that the impedance matching units 13, 14 compete in stabilizing the plasma 26 and thereby actually worsen the impedance matching and the instability of the plasma 26.

The impedance matching unit 13 may also be connected via a direct data link 50 to the RF power source 11. Thus, the RF power source 11 may be controlled by the impedance matching unit 13. In particular, control signals may be sent via the direct data link 50 to put the impedance matching, in particular the frequency tuning, of the RF power source 11 on hold.

The impedance matching unit 14 may also be connected via a direct data link 51 to the RF power source 12. Thus, the RF power source 12 may be controlled by the impedance matching unit 14. In particular, control signals may be sent via the direct data link 51 to put the impedance matching, in particular the frequency tuning, of the RF power source 12 on hold.

The impedance matching unit 13 may also be connected via a direct data link (not shown) to the RF power source 12. Thus, the RF power source 12 may be controlled by the impedance matching unit 13. In particular, control signals may be sent via the direct data link to put the impedance matching, in particular the frequency tuning, of the RF power source 12 on hold.

Additionally, the RF power sources 11, 12 may be connected via a direct data link 52. The RF power source 12 may be embodied in the same way as the RF power source 11.

Figure 2:
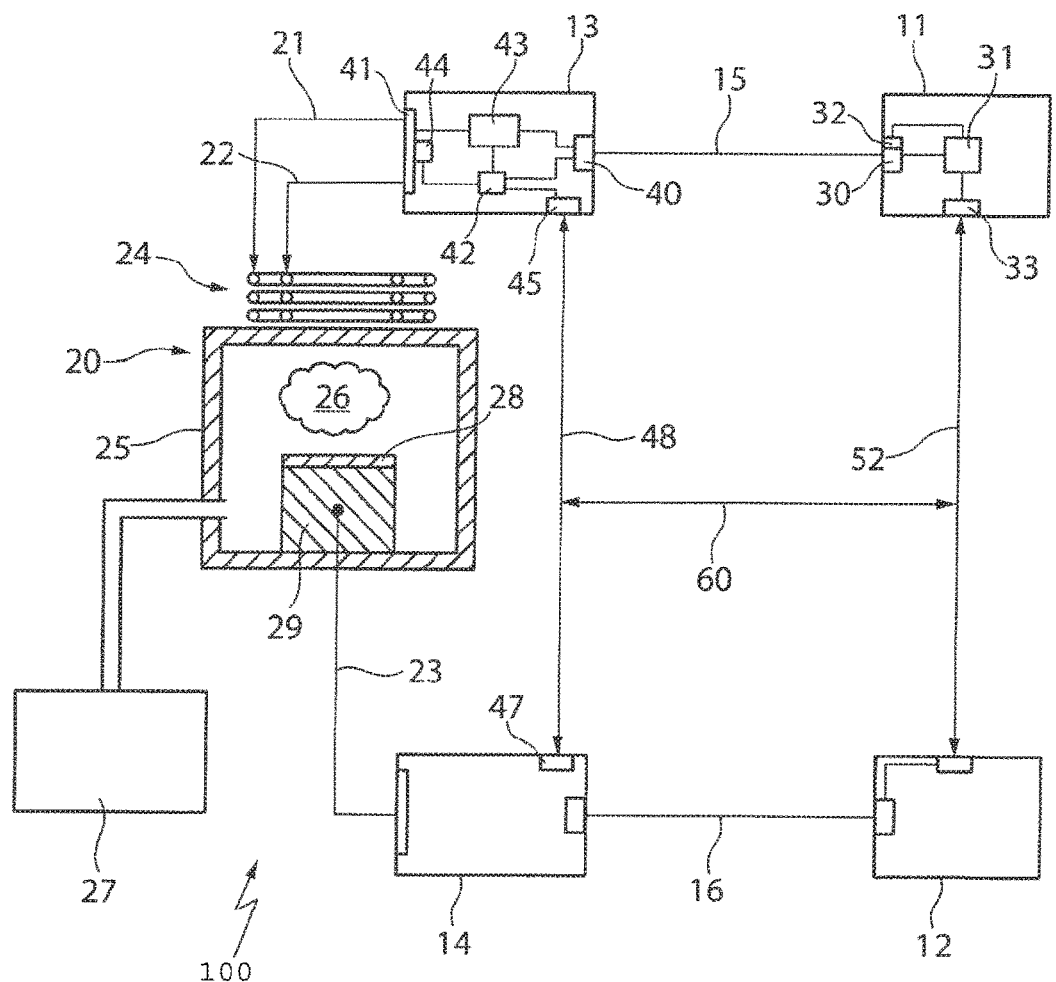
FIG. 2 is a schematic diagram of another example plasma supply system.

The embodiment of an alternative plasma power system 100 shown in FIG. 2 largely corresponds to the plasma supply system 10 shown in FIG. 1. The difference is that the direct data links 50, 51 between the impedance matching units 13, 14 and RF power sources 11, 12 are now replaced by a data link connection 60 connecting the direct data links 48, 52. This means that the matching units 13, 14 and the RF power sources 11, 12 are now connected by one direct data link. Thus, the impedance matching unit 13 can operate as a master and in particular control the impedance matching performed by the second impedance matching unit 14, the RF power source 11 and the RF power source 12. For example, if an instability is detected in the plasma chamber 25, the impedance matching unit 13 can put the other components, e.g., the second impedance matching unit 14, the RF power source 11 and the RF power source 12 on hold. In that case, the second impedance matching unit 14, the RF power source 11 and the RF power source 12 do not perform impedance matching. Once the impedance matching unit 13 has performed impedance matching and stabilized the plasma, the second impedance matching unit 14, the RF power source 11 and the RF power source 12 can be released so that they can also perform impedance matching.

Alternatively, the impedance matching unit 13 can allow one of the other components to perform impedance matching, while the other components are put on hold, including the impedance matching unit 13. It is also conceivable that the first impedance matching unit 13, the second impedance matching unit 14, the RF power source 11 and the RF power source 12 in turn perform impedance matching, while the other components are put on hold.

All devices, especially the controller 31, 42 may be configured to work fully or at least partially in a digital mode. This means all or at least some of the measured signals are digitized with an ADC. The data link interface may be a digital data link interface. The controller 31, 42 may include a data memory and a program memory. The controller 31, 42 may include a microcontroller. The controller 31, 42 may include a programmable logic unit. The controller 31, 42 may include one or more internal timers and one or more DAC. The controller 31, 42 may include an additional interface for communication with customer. This may be an output device such as a display, and an input device such as a keyboard, wheel, or other devices. Both input and output devices could also be realized as interfaces like Ethernet, Profibus, USB, WiFi, Bluetooth, or others to connect external devices.

A number of embodiments of the invention have been described. Nevertheless, it will be understood that various modifications may be made without departing from the spirit and scope of the invention. Accordingly, other embodiments are within the scope of the following claims.

What is claimed is:

1. A plasma impedance matching unit for a plasma power supply system, the plasma impedance matching unit comprising:
   a first power connector configured to couple the plasma impedance matching unit to a radio frequency (RF) power source;
   a second power connector configured to couple the plasma impedance matching unit to a plasma load;
   a data link interface configured to couple the plasma impedance matching unit to a second plasma impedance matching unit of the plasma power supply system via a data link; and
   a controller configured to control the plasma impedance matching unit to match an impedance from the first power connector to an impedance at the second power connector,
   wherein the controller is configured to:
      operate as a master for at least one of one or more other impedance matching units and one or more RF power sources of the plasma power supply system,
      communicate via the data link interface with the at least one of the other impedance matching units and the RF power sources of the plasma power supply system, and
      determine which plasma impedance matching unit performs impedance matching with the plasma load and which impedance matching unit is put on hold to not perform impedance matching with the plasma load.

2. The plasma impedance matching unit of claim 1, wherein the controller is configured to directly access data of the plasma impedance matching unit.

3. The plasma impedance matching unit of claim 1, further comprising a metallic housing.

4. The plasma impedance matching unit of claim 3, wherein the data link interface is placed directly at the metallic housing.

5. The plasma impedance matching unit of claim 3, wherein at least one of the first power connector and the second power connector is placed directly at the metallic housing.

6. The plasma impedance matching unit of claim 1, further comprising a plurality of reactances controlled by the controller.

7. The plasma impedance matching unit of claim 1, further comprising at least one sensor configured to measure a value related to the impedance at the second power connector.

8. The plasma impedance matching unit of claim 7, wherein the sensor is configured to detect arcs in a plasma process associated with the plasma load.

9. The plasma impedance matching unit of claim 8, further comprising a connection disposed between the sensor and the controller, such that the controller is capable of controlling a matching network of the plasma impedance matching unit based on the measured data.

10. The plasma impedance matching unit of claim 1, wherein the controller is configured to perform at least one of:
    sending a hold signal to the at least one of the other impedance matching units and the RF power sources, and
    receiving a hold signal from one of the at least one of the other impedance matching units and the RF power sources.

11. The plasma impedance matching unit of claim 1, wherein the controller is configured to detect a plasma state condition associated with the plasma load.

12. The plasma impedance matching unit of claim 11, wherein the plasma state condition comprises instabilities in a plasma associated with the plasma load.

13. The plasma impedance matching unit of claim 11, wherein the controller is configured to send one of a hold signal and a start signal to a controller of the second plasma impedance matching unit after the detection of the plasma state condition.

14. The plasma impedance matching unit of claim 13, wherein the controller is configured to send the one of the hold signal and the start signal in dependence on a detection of one of an ignition of a plasma, arcing, a stable or instable plasma, and other abnormality of the plasma.

15. A system for supplying RF power to a plasma load, the system comprising:
    a first RF power source;
    a first plasma impedance matching unit for coupling the first RF power source to the plasma load;
    a second RF power source;
    a second plasma impedance matching unit for coupling the second RF power source to the plasma load; and
    a data link configured to directly connect the first and second plasma impedance matching units.

16. The system of claim 15, wherein at least one of the RF power sources is configured to work in one of a pulsed mode and a mode where a frequency of the at least one of the RF power sources is controlled to accomplish impedance matching to the plasma load.

17. The system of claim 15, wherein the first RF power source and the second RF power source are directly connected via a second data link.

18. The system of claim 15, further comprising at least one of
    a first additional data link for connecting the first RF power source to the first plasma impedance matching unit, and
    a second additional data link for connecting the second RF power source to the second plasma impedance matching unit.

19. A method of supplying RF power to a plasma load by a power supply system, the method comprising:
    supplying first RF power generated by a first RF power source of the power supply system to a plasma load via a first impedance matching unit of the power supply system;
    supplying second RF power generated by a second RF power source of the power supply system to the plasma load via a second impedance matching unit of the power supply system; and
    sending data from the first impedance matching unit to the second impedance matching unit via a direct data link.

20. The method of claim 19, further comprising:
    sending second data from the first RF power source to the second RF power source via a second direct data link.

21. The method of claim 19, wherein the direct data link and the second direct data link are connected via a direct data link connection, such that the first RF power source, the second RF power source, the first impedance matching unit, and the second impedance matching unit are connected for data exchange.

22. The method of claim 19, further comprising:
   detecting an instability of a plasma associated with the plasma load; and
   performing impedance matching to cause no competition in stabilizing the plasma among impedance matching units and RF power sources of the power supply system.

23. The method of claim 22, wherein performing the impedance matching comprises:
   operating one of the impedance matching units and RF power sources of the power supply system to impedance match the plasma load; and
   putting the other of the impedance matching units and RF power sources of the power supply system on hold to not impedance match the plasma load.

24. The method of claim 22, wherein performing the impedance matching comprises:
   operating one of the impedance matching units at a time to impedance match the plasma load; and
   putting the other impedance matching units of the plasma supply system on hold to not impedance match the plasma load.

25. The method of claim 22, wherein performing the impedance matching comprises:
   operating one of the RF power sources at a time to impedance match the plasma load; and
   putting the other RF power sources of the plasma supply system on hold to not impedance match the plasma load.

* * * * *